United States Patent [19]

Komatsu

[11] Patent Number: 4,692,190
[45] Date of Patent: Sep. 8, 1987

[54] TRIMMING OF METAL INTERCONNECTION LAYER BY SELECTIVE MIGRATION OF METAL ATOMS BY ENERGY BEAMS

[75] Inventor: Shigeru Komatsu, Kitakyushu, Japan

[73] Assignee: Kabushiki Kaisha Toshiba, Kawasaki, Japan

[21] Appl. No.: 813,039

[22] Filed: Dec. 24, 1985

[30] Foreign Application Priority Data

Dec. 27, 1984 [JP] Japan .................................. 59-273740

[51] Int. Cl.⁴ .................... H01C 7/00; B23K 26/00
[52] U.S. Cl. .......................... 437/189; 148/DIG. 93;
148/DIG. 140; 357/65; 437/173
[58] Field of Search ................. 148/1.5, 187; 29/571,
29/576 B, 578, 584; 357/65

[56] References Cited

U.S. PATENT DOCUMENTS

| | | | |
|---|---|---|---|
| 4,179,310 | 12/1979 | Compton et al. | 148/1.5 |
| 4,217,570 | 8/1980 | Holmes | 29/121 LM |
| 4,240,094 | 12/1980 | Mader | 29/584 |
| 4,561,906 | 12/1985 | Calder et al. | 148/1.5 |
| 4,585,490 | 4/1986 | Raffel et al. | 148/1.5 |
| 4,606,781 | 8/1986 | Vyne | 148/183 |

OTHER PUBLICATIONS

Aggarwal, B. K., IBM-TDB, 21, (1979), 3271.
Bergeron et al., IBM-TDB, 24, (1982), 4656.
Green et al., IBM-TDB, 24, (1982), 5466.

Primary Examiner—Upendra Roy
Attorney, Agent, or Firm—Finnegan, Henderson, Farabow, Garrett and Dunner

[57] ABSTRACT

Semiconductor body is prepared and a film is formed on the semiconductor body, followed by forming an interconnection layer of aluminum alloy on the insulating film. A silicon oxide film is formed on the interconnection layer, followed by removing that portion of the silicon oxide film which is situated on a predetermined trimming area of the interconnection layer. A silicon nitride film is formed on the whole surface of the resultant structure. An energy beam is directed onto the predetermined trimming area of the interconnection layer, causing the interconnection layer to be locally heated to 400° to 600° C. whereby atoms in the interconnection layer migrate to permit the interconnection layer to be trimmed.

9 Claims, 12 Drawing Figures

F I G. 1
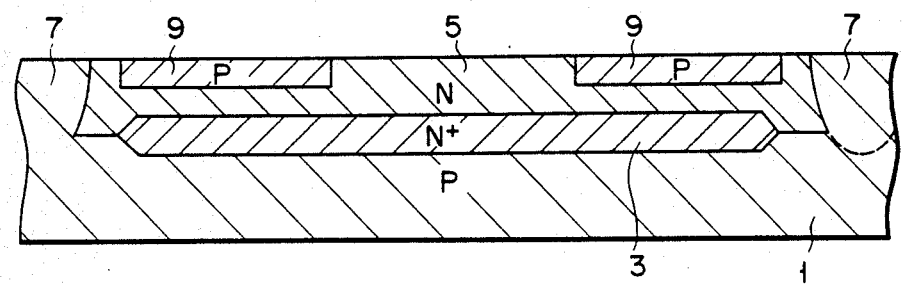
F I G. 2
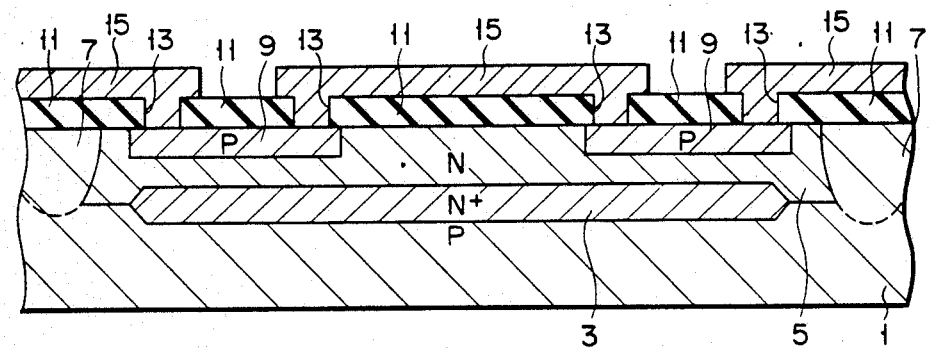
F I G. 3
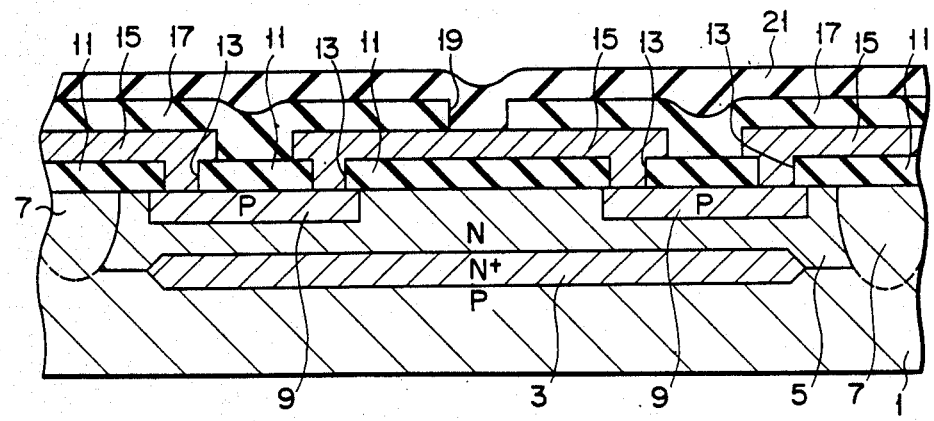

F I G. 4
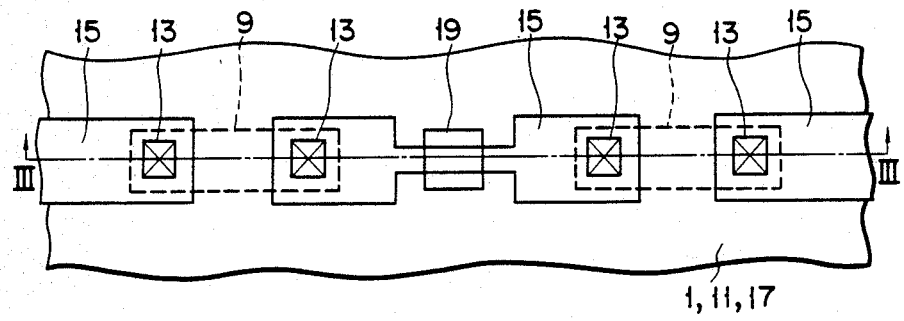
F I G. 5
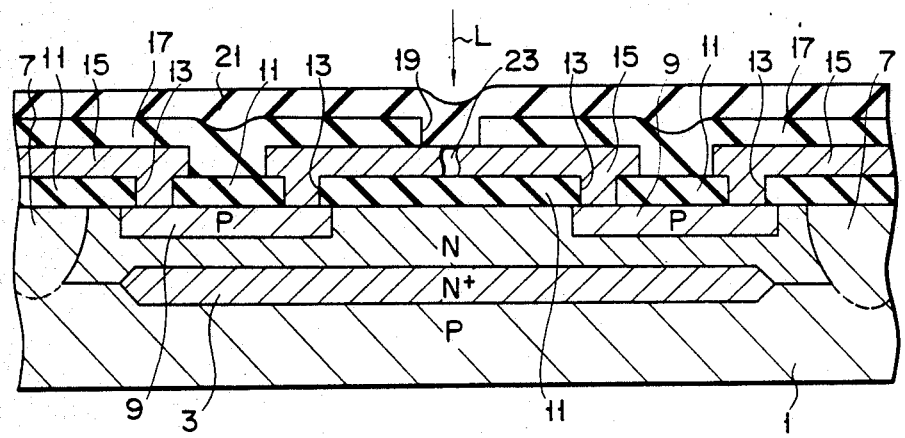
F I G. 6
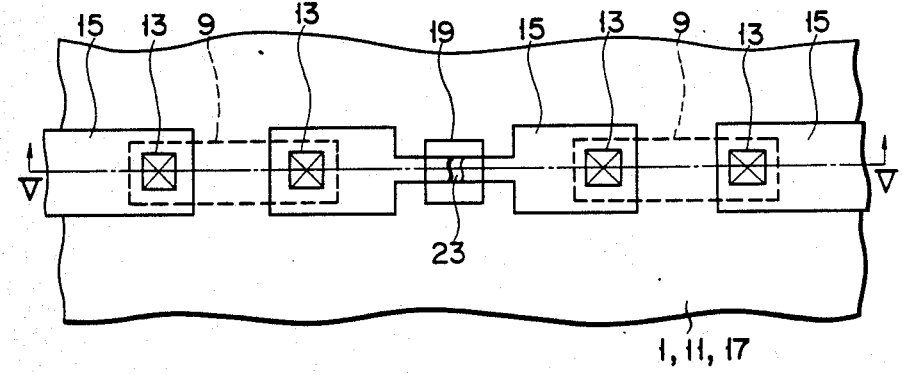

TRIMMING OF METAL INTERCONNECTION LAYER BY SELECTIVE MIGRATION OF METAL ATOMS BY ENERGY BEAMS

BACKGROUND OF THE INVENTION

This invention relates to a method for trimming a metal interconnection layer of a semiconductor device.

A technique is known in the art which trims an interconnection layer so as to obtain, for example, highly accurate resistors. The trimming process has been carried out as follows: First, an insulating film is formed on the surface of a semiconductor substrate and a semiconductor or a metal interconnection layer is formed on the insulating film. A passivation film is formed on the interconnection layer. Then, a high energy laser beam selectively illuminates predetermined portions of the interconnection layer to permit the interconnection layer to be locally heated to about 650° C. This process causes the interconnection layer to be melted, trimming or partially eliminating the interconnection layer.

In the above-mentioned trimming technique such a high energy laser beam is directed onto the interconnection layer and, therefore, there is a possibility that a crack will occur in a passivation film and that damage will take place at the underlying insulating film or semiconductor substrate. With a resin-sealing type semiconductor device in particular, the interconnection layer is liable to be attacked, prominently lowering the reliability with which the semiconductor device operates. Furthermore, where the underlying insulating film and semiconductor substrate are damaged, a short-circuiting occurs between the interconnection layer and the semiconductor substrate, resulting in lowered reliablity.

SUMMARY OF THE INVENTION

It is accordingly the object of this invention to provide a method for manufacturing a semiconductor device which can trim an interconnection layer without causing damage to the rest of the semiconductor device.

In order to achieve the above-mentioned object a method for manufacturing a semiconductor device is provided which comprises the steps of:

preparing a semiconductor body (1, 3, 5, 7, 9);

forming at least one insulating film (11) on the semiconductor body (1, 3, 5, 7, 9);

forming at least one metal interconnection layer (15) on the insulating film (11);

forming a first insulating film (21) contacting the interconnection layer (15) at least one predetermined area including a portion of the interconnection layer as well as a second insulating film (17) on an area other than the predetermined area, a ratio of a thermal expansion coefficient of the first insulating film (21) to that of the interconnection layer (15) being smaller than a ratio of a thermal expansion coefficient of the first insulating film (21) to that of the interconnection layer (15); and directing an energy beam (L) onto the predetermined area of the interconnection layer, causing it to be heated to permit migration of atoms therein.

If the semiconductor device is manufactured by the above-mentioned steps, the interconnection layer permits migration of atoms therein at a relatively low temperature (400° to 600° C.) and the consequent trimming of the interconnection layer. If, therefore, the interconnection layer is to be trimmed, this can be done very accurately without causing damage to the insulating films overlying or underlying the interconnection layer.

It is possible to obtain a very reliable semiconductor device by this method of this invention.

BRIEF DESCRIPTION OF THE DRAWINGS

FIG. 1 is a cross-sectional view for explaining a method for manufacturing a semiconductor device according to one embodiment of this invention;

FIG. 2 is a cross-sectional view for explaining the method for manufacturing the semiconductor device of FIG. 1;

FIG. 3 is a cross-sectional view for explaining the method for manufacturing the semiconductor device of FIG. 1;

FIG. 4 is a plan view showing the semiconductor device of FIG. 3;

FIG. 5 is a cross-sectional view showing the semiconductor device of FIG. 1;

FIG. 6 is a plan view showing the semiconductor device of FIG. 5;

DETAILED DESCRIPTION OF THE PREFERRED EMBODIMENT

Figure 7:
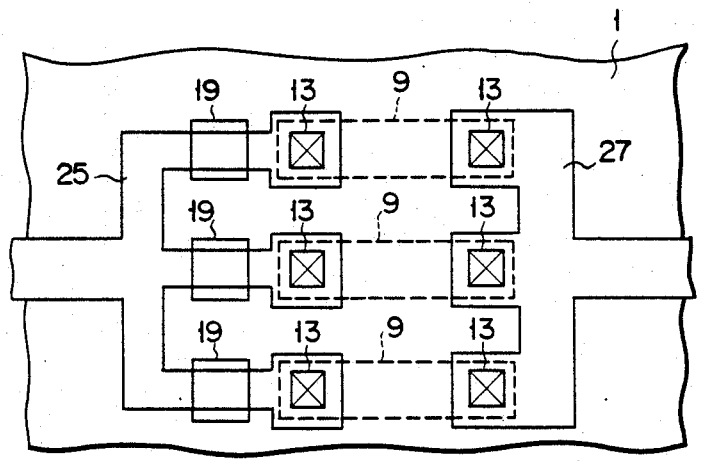
FIG. 7 is a plan view for explaining one embodiment of the semiconductor device of FIG. 1 as obtained by a practical method of this invention.

A semiconductor device according to one embodiment of this invention will be explained below with reference to FIGS. 1 to 6. This embodiment explains following case. Two resistors formed in a semiconductor substrate is connected to a metal interconnection layer on a semiconductor substrate. The metal interconnection layer is broken according to this invention. In FIGS. 1 to 6, the portions of the semiconductor device which unnecessary for the explanation are omitted for ease in understanding.

First, N type high concentration layer serving as buried layer 3 is formed in the surface portion of semiconductor substrate 1 by a known ordinary method and an N type layer is formed on semiconductor substrate 1 by, for example, an epitaxial growth method, thereby providing above-mentioned buried layer 3 of the N type high concentration. Then, P type element separation region 7 is formed in the surface portion of the resultant structure to provide N type epitaxial region (island) 5 which is electrically separated from the other area and which is for element formation. Two P type resistors 9 are formed by ion implanting or diffusing an impurity in N type epitaxial layer 5. The arrangement as indicated by the cross-section in FIG. 1 is formed by the above-mentioned manufacturing steps.

Field oxide film 11 is formed on the whole surface of the resultant structure and contact holes 13 are formed at predetermined positions in field oxide film 11. An aluminum alloy film of the order of an accuracy of 0.6 $\mu$m to 2 $\mu$m in thickness is formed by, for example, an evaporation method on the whole surface of the resultant structure. The aluminum alloy may be an aluminum/silicon (Al/Si) alloy or an aluminum/silicon/copper (Al/Si/Cu) alloy or may be replaced by a pure aluminum. The aluminum alloy is deposited in the contact hole 13 to provide a contact through which the interconnection layer as set forth later is connected to corresponding resistor 9. The alloy film is etched to provide metal interconnection layer 15. Metal interconnection layer 15 is so formed that the portion thereof to be trimmed is narrow in plan view in FIG. 4 as describe later. It is to be noted, however, that the portion of metal interconnection layer 15, which is to be trimmed, is not necessarily required to be narrower than the other portion of the interconnection layer 15. The structure as shown in FIG. 2, is obtained by above-mentioned steps.

Silicon oxide (SiO$_2$) film (a second oxide film) 17 of 0.6 to 2 μm in thickness is deposited by a CVD method on the whole surface of the resultant structure. This CVD oxide film 17 serves as a passivation film for the semiconductor device. CVD oxide film 17 is selectively etched to provide opening 19. Opening 19 is so formed at the to-be-trimmed area (a predetermined trimming area) and its neighborhood of metal interconnection layer 15 as to have, for example, a square configuration. The predetermined trimming area and its neighborhood are exposed by opening 19. Silicon nitride (Si$_3$N$_4$) film (a first insulating film) 21 of 0.6 to 2 μm in thickness is deposited by, for example, a plasma reaction method on the whole surface of the resultant structure. Silicon nitride film 21 directly contacts metal interconnection layer 15 at the location of opening 19. In these manufacturing steps, as shown in FIGS. 3 and 4, a semiconductor device is obtained which comprises semiconductor body (1, 3, 5, 7, 9); insulating film 11 formed on the semiconductor body; metal interconnection layer 15 formed on insulating film 11; silicon nitride film (the first insulating film) 21 formed in direct contact with a predetermined area (an area defined by the opening 19) including the predetermined trimming area of metal interconnection layer 15; and CVD oxide film (the second insulating film) formed on other than the above-mentioned area of metal interconnection layer 15. It is to be noted that FIG. 3 is the cross-sectional view as taken along line III—III in FIG. 4.

A laser beam L is directed onto the area in which silicon nitride film 21 is in contact with metal interconnection layer 15, so as to locally heat metal interconnection layer 15 from 400° to 600° C. Metal interconnection layer 15 (aluminum alloy) 15, CVD oxide film 17 and silicon nitride film 21 have expansion coefficients of 2.5×10$^{-5}$ (/deg), 4.0×10$^{-5}$ (/deg) and 5.0×10$^{-6}$ (/deg), respectively. As evident from the above, the expansion coefficient of silicon nitride film 21 is about one order of magnitude smaller than those of metal interconnection layer 15 and CVD oxide film 17. Silicon nitride film 21 is in direct contact with the predetermined trimming area of metal interconnection layer 15. When the predetermined trimming area of metal interconnection layer 15 is heated, a stress is produced at metal interconnection layer 15 due to differences in thermal expansion coefficients among metal interconnection layer 15, silicon nitride film 21 and CVD oxide film 17, causing migration of atoms and the consequent diffusion of the atoms in metal interconnection layer 15 into silicon nitride film 21. As a result, metal interconnection layer 15 partially disappears and thus metal interconnection layer 15 is trimmed as at 23. By so doing, it is possible to provide a semiconductor device whose interconnection layer 15 has been broken as shown in FIGS. 5 and 6. FIG. 5 is a cross-sectional view as taken along line V—V in FIG. 6. In this way, resistors 9 are electrically isolated from each other.

In the aspect of this trimming method a laser beam of lower energy is directed onto interconnection layer 15 and thus interconnection layer 15 can be trimmed while a small temperature rise prevails, for example, at metal interconnection layer 15 and insulating films 17 and 21. For this reason there occurs no damage, such as a crack, to CVD oxide film 17 and silicon nitride film 21 is in the neighborhood of the broken portion 23 of the interconnection layer 15. After the completion of the semiconductor device there is no possibility that metal interconnection layer 15 will be attacked in the semiconductor device and that the reliability with which the device operates will not be lowered. Furthermore, there occurs no damage to not only field oxide film 11 but also silicon substrate 1 and epitaxial layer 5. In consequence, the reliability of the semiconductor device will not be lowered by such a trimming step.

Although in the first embodiment the interconnection layer connecting the two resistors in the semiconductor substrate has been trimmed by the above-mentioned trimming method, this invention will not be restricted thereto. For example, this invention can of course be applied to trimming an interconnection layer connecting two resistors on a semiconductor substrate. This invention is not limited to trimming the interconnection layer connecting the resistors in or on the semiconductor substrate. This invention is also applied to trimming all kinds of interconnection layers.

The method according to the first embodiment of this invention will now be described below with reference to FIG. 7, as being applied to a practical semiconductor device fabrication method. In FIG. 7 similar reference numerals are employed to designate parts or elements corresponding to those shown in FIGS. 1 to 6. Further explanation is, therefore, omitted. In the embodiment shown in FIG. 7, three resistors 9 are formed in a parallel array. One end of each resistor 9 is connected to another portion, not shown, of the semiconductor device through aluminum interconnection layer 25. Another end of each resistor 9 is connected to a still another portion, not shown, of the semiconductor device through interconnection layer 27. On the other hand, silicon nitride film 21 is in contact with predetermined trimming areas of interconnection layer 25 through openings 19, respectively. Silicon oxide film 17 is in contact with another portion of interconnection layer 25. Even in the arrangement shown in FIG. 7, when a laser beam is directed onto the predetermined trimming area of interconnection layer 25, atoms in interconnection layer 25 migrate, resulting in a breakage of interconnection layer 25. In the arrangement shown in FIG. 7 a resistive value between interconnection layers 25 and 27 can be adjusted by properly breaking the predetermined trimming areas of interconnection layer 25 in a selective fashion. Resistors 9 are not restricted to three in number.

Figure 8:
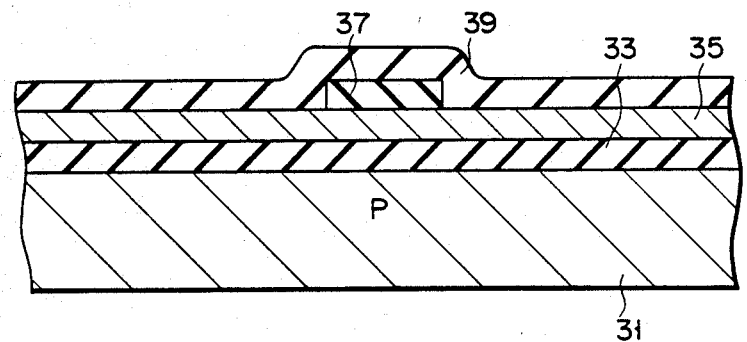
FIGS. 8 and 9 are cross-sectional views for explaining a semiconductor device according to a second embodiment of this invention.
Figure 9:
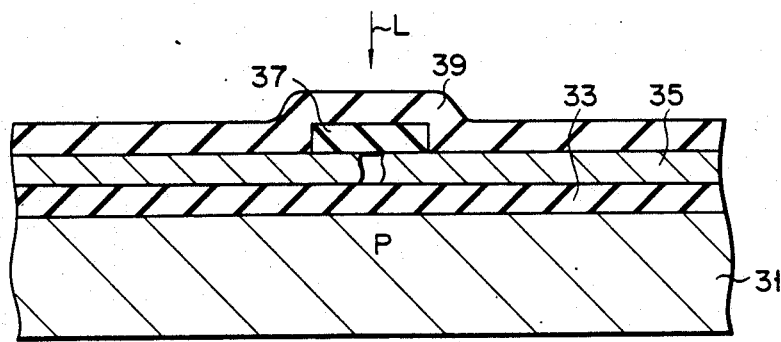

In the above-mentioned embodiments the CVD oxide film is formed on metal interconnection layer 15, 25, openings 19 are formed in the portion of CVD oxide film 17 and silicon nitride film 21 is formed on the whole surface of the resultant structure. CVD oxide film 17 and silicon nitride film 21 may be formed in reverse order. Such a semiconductor device fabrication method will be explained below with reference to FIGS. 8 and 9. Field oxide film 33 is formed on the surface of P type silicon substrate 31 and an aluminum alloy is evaporated on field oxide film 33, followed by performing a patterning step to provide an interconnection layer. A silicon nitride is deposited on the whole surface of the resultant structure to form a silicon nitride film. Then, the silicon nitride film is patterned, leaving silicon nitride film 37 on only the specific portion of interconnection layer 35. CVD oxide film 39, serving as passivation film, is formed on the whole surface of the resultant structure, thereby obtaining a semiconductor device whose arrangement is shown in FIG. 8. A laser beam L is selectively directed onto the portion or portions of the interconnection layer 35, which are in contact with silicon nitride film 37, to cause interconnection layer 35 to be heated locally. As a result, the atoms in interconnection layer 35 migrate, thus breaking interconnection layer 35 as shown in FIG. 9. Although in this embodiment the silicon nitride film has been formed beneath the CVD oxide film, this method can still gain the same advantages as in the first embodiment.

Figure 10:
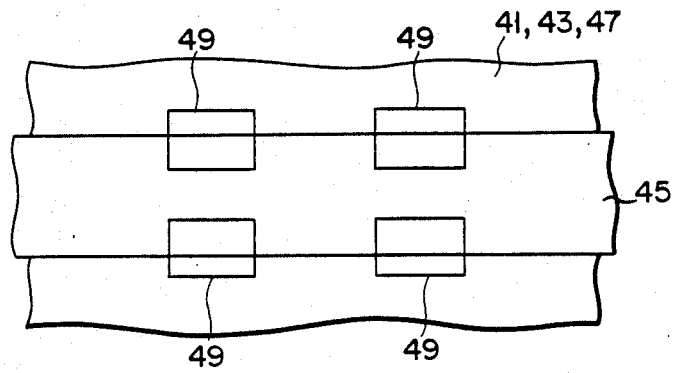
FIGS. 10 and 11 are plan views for explaining a semiconductor device according to a third embodiment of this invention.
Figure 11:
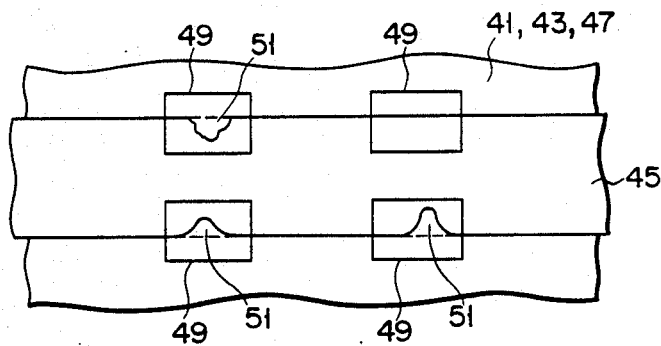

Although in the above-mentioned embodiments, the interconnection layer formed of the aluminum alloy has been explained as being completely broken, this invention is not restricted to these embodiments. The interconnection layer may be partially dissipated in place of completely breaking the interconnection layer. This can be achieved by properly adjusting the diameter and energy dosage of the laser beam as well as the irradiation time of the laser beam. Only the portion of the interconnection layer can be dissipated by forming the silicon nitride film in contact with only the portion of the interconnection layer. This embodiment will be explained below with reference to FIGS. 10 and 11. In this embodiment, field insulating film 43 is formed to cover a semiconductor substrate 41. Then, interconnection layer 45 is formed on field oxide film 43 and CVD oxide film 47 is formed on the whole surface of the resultant structure. As shown in FIG. 10 four openings 49 are formed in CVD oxide film to expose only portions of interconnection layer 45 which are situated in a direction of the thickness of interconnection layer 45. Silicon nitride film 51 is formed on the whole surface of the resultant structure and interconnection layer 45 directly contacts silicon nitride film 47 only at the locations of regions 49. A laser beam is directed onto those portions of the interconnection layer 45 which are in direct contact with silicon nitride film 47. As shown in FIG. 11 atoms migrate in interconnection layer 35, leaving behind dissipated areas 51. In FIG. 11 interconnection layer 45 directly contacts silicon nitride film 47 at four locations of interconnection layer 45 and the atoms migrate at three of the four locations. According to this invention the trimming of the interconnection layer can be partially carried out. The resistive value of interconnection layer 45 becomes a target value accurately by trimming interconnection layer 45 by small amounts, while measuring the resistive value of interconnection layer 45 by for example, a tester, and finely adjusting the resistive value of interconnection layer 45.

Figure 12:
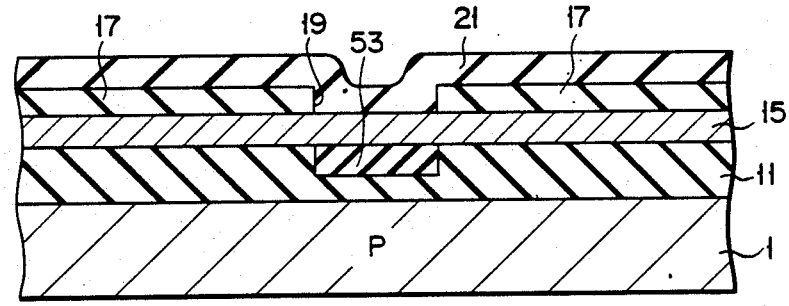
FIG. 12 is a cross-sectional view for explaining a semiconductor device according to a fourth embodiment of this invention.

Although in the above-mentioned embodiment the silicon nitride film has been explained as being formed only on the interconnection layer of aluminum alloy, this invention is not restricted thereto. As shown in FIG. 12 a film for migration may be formed beneath aluminum interconnection 15. In FIG. 12 similar reference numerals are employed to designate portions or elements corresponding to those shown in FIGS. 1 to 6. Further explanation is, therefore, omitted. In FIG. 12, silicon nitride film or silicon carbide (SiC) 53 is formed in contact with the undersurface of the predetermined trimming area of interconnection layer 15. This invention is not restricted to forming nitride silicon film 53 beneath the predetermined trimming area only. Between interconnection layer 15 and silicon oxide film 11, for example, silicon nitride film may be formed on the whole surface of the semiconductor device. In this way a film for migration can be formed also beneath interconnection layer 15, permitting atoms in the interconnection layer to be accelerated thereinto. It is proved effective that in order to accelerate migration of atoms silicon nitride film 21 is thickly formed on the predetermined trimming area.

The first insulating film is not restricted to the silicon nitride. As the first insulating film use may be made of silicon carbide (SiC). And also, this invention is not restricted to silicon carbide. The feature of this invention resides in that the first insulating film in contact with the predetermined trimming area has a thermal expansion coefficient smaller than that of the second insulating film in contact with an area other than the predetermined trimming area of the interconnection layer.

The semiconductor substrate may be either of a P conductivity type or of an N conductivity type. The semiconductor device is not restricted to a bipolar type. This invention may be applied to either a MOS type or a CMOS type.

This invention is not restricted to the case where the interconnection layer of the semiconductor device is to be broken (FIGS. 5 and 6), and the case where edges of the interconnection layer are partially lacking (FIG. 11). Accord-ing to this invention, "migration" may occur anywhere or at any spot or spots at the interconnection layer. Furthermore, this invention is not restricted to trimming the interconnection layer connecting the resistors, etc. This invention may be applied to any interconnection layer or layers where a trimming operation is necessary.

This invention is not restricted to the use of a laser beam whereby the predetermined trimming area of the interconnection layer or layers is partially heated. According to this invention any kinds of energy beams may be used if the aluminum interconnection layer can be heated locally.

What is claimed is:

1. A method for manufacturing a semiconductor device, comprising the steps of:
   preparing a semiconductor body;
   forming at least one insulating layer on said semiconductor body;
   forming at least one interconnection layer on said insulating layer;
   forming a first insulating film above and contacting at least one predetermined are including at least a portion of said interconnection layer;
   forming a second insulating film above and contacting said interconnection layer at an area other than said predetermined area, a ratio of a thermal expansion coefficient of said first insulating film to that of said interconnection layer being smaller than a ratio of a thermal expansion coefficient of said second insulating film to that of said interconnection layer to apply a stress at the predetermined area of said interconnection layer at times when said interconnection layer is heated; and
   directing an energy beam onto the predetermined area of the interconnection layer, thus heating the predetermined area to a temperature between 400° to 600° C. to permit migration of atoms of the predetermined area of said interconnection layer into said first insulating film at times when said interconnection layer is heated by said energy beam to a temperature between 400° to 600° C.

2. The method according to claim 1, in which said interconnection layer is formed of either one of aluminum and aluminum alloy; said first insulating film is formed of either one of silicon nitrode and silicon carbide and said second insulating film is formed of silicon oxide.

3. The method according to claim 1, in which said step of forming first and second insulating films comprises step of forming said second insulating film on said interconnection layer, step of removing said second insulating film on said predetermined area and step of forming said first insulating film at least on a removed portion of said second insulating film, said first insulating film being in direct contact with said interconnection layer.

4. The method according to claim 1, in which said step of forming first and second insulating films comprises step of forming said first insulating film on said predetermined area and forming said second insulating film at least on said first insulating film and that area of said interconnection layer other than said predetermined area.

5. The method according to claim 1, in which said step of forming an insulating layer on said semiconductor body comprises step of forming a third insulating film on said semiconductor body and step of forming a fourth insulating film on said third insulating film such that it contacts at least that undersurface of said interconnection layer above which said first insulating film is in contact with said interconnection layer, a ratio of a thermal expansion coefficient of said third insulating film to that of said interconnection layer being bigger than a ratio of a thermal expansion coefficient of said fourth insulating film to that of said interconnection layer.

6. The method according to claim 1, in which said step of directing an energy beam comprises irradiating said interconnection layer with a laser beam.

7. The method according to claim 1, in which said step of directing an energy beam comprises locally heating said interconnection layer, causing pressure to act upon said interconnection layer due to a difference between a thermal expansion coefficient of said interconnection layer and those of said first and second insulating films whereby atoms in said interconnection layer are diffused into said first insulating film due to their migration to trim said interconnection layer.

8. The method according to claim 1, in which said step of directing an energy beam comprises radiating a laser beam onto said interconnection layer, causing said interconnection layer to be locally heated to 400° to 600° C. to permit pressure to act upon the interconnection layer due to a difference between the thermal expansion coefficient of the interconnection layer and those of said first and second insulating films, whereby atoms in said interconnection layer are diffused into said first insulating film due to their migration to trim said interconnection layer.

9. The method according to claim 5, in which said interconnection layer is formed of either one of aluminum and aluminum alloy, said third insulating film is formed of silicon dioxide and said fourth insulating film is formed of either one of silicon nitride and silicon carbide.

* * * * *